(12) United States Patent
Park et al.

(10) Patent No.: US 7,052,965 B2
(45) Date of Patent: May 30, 2006

(54) METHODS OF FABRICATING MOS FIELD EFFECT TRANSISTORS WITH POCKET REGIONS USING IMPLANT BLOCKING PATTERNS

(75) Inventors: Chang-hyun Park, Kyungki-do (KR); Young-gun Ko, Kyungki-do (KR); Chang-bong Oh, Kyungki-do (KR); Hee-sung Kang, Kyungki-do (KR); Sang-jin Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 10/780,245

(22) Filed: Feb. 17, 2004

(65) Prior Publication Data
US 2004/0219724 A1    Nov. 4, 2004

(30) Foreign Application Priority Data
Feb. 19, 2003    (KR) ............... 10-2003-0010323

(51) Int. Cl.
*H01L 21/336* (2006.01)
(52) U.S. Cl. .............. 438/302; 438/305; 438/306; 438/525; 257/E21.634
(58) Field of Classification Search ........... 438/302, 438/305, 306, 825; 257/E21.634
See application file for complete search history.

(56) References Cited

U.S. PATENT DOCUMENTS

| 5,733,792 | A | | 3/1998 | Masuoka |
| 6,130,011 | A | * | 10/2000 | Liao ............................ 430/5 |
| 6,133,124 | A | * | 10/2000 | Horstmann et al. ......... 438/525 |
| 6,168,995 | B1 | * | 1/2001 | Kelley et al. ............... 438/266 |
| 6,489,223 | B1 | * | 12/2002 | Hook et al. ................. 438/524 |
| 6,551,871 | B1 | * | 4/2003 | Takamura ................... 438/223 |
| 6,596,570 | B1 | * | 7/2003 | Furukawa ................... 438/162 |
| 6,806,156 | B1 | * | 10/2004 | Lenoble et al. ............. 438/303 |
| 2002/0081795 | A1 | * | 6/2002 | Kim et al. ................... 438/200 |
| 2003/0220770 | A1 | * | 11/2003 | Eikyu ........................... 703/1 |
| 2004/0087095 | A1 | * | 5/2004 | Handa et al. ............... 438/302 |

* cited by examiner

*Primary Examiner*—George Fourson
*Assistant Examiner*—Thanh Van Pham
(74) *Attorney, Agent, or Firm*—Myers Bigel Sibley & Sajovec

(57) ABSTRACT

MOSFETs with pocket regions are fabricated. A gate electrode layer is formed on a semiconductor substrate; and lightly doped drain regions are formed in the semiconductor substrate adjacent the gate electrode layer. A blocking pattern is formed on the semiconductor substrate where the gate electrode layer is formed. The blocking pattern is adjacent and spaced apart from the gate electrode layer a predetermined distance and exposes portions of the semiconductor substrate adjacent sidewalls of the gate electrode layer. Pocket regions are formed in the semiconductor substrate by implanting impurity ions using the gate electrode layer and the blocking pattern as an ion implantation mask.

15 Claims, 7 Drawing Sheets

METHODS OF FABRICATING MOS FIELD EFFECT TRANSISTORS WITH POCKET REGIONS USING IMPLANT BLOCKING PATTERNS

CLAIM OF PRIORITY

This application claims the priority of Korean Patent Application No. 2003-10323, filed on Feb. 19, 2003, in the Korean Intellectual Property Office, the disclosure of which is incorporated herein by reference in its entirety.

FIELD OF THE INVENTION

The present invention relates to methods of fabricating a metal-oxide-semiconductor field effect transistor (hereinafter, referred to as a "MOSFET"). More particularly, the present invention relates to methods of fabricating a MOSFETs to suppress short channel effects.

BACKGROUND OF THE INVENTION

With the increasing integration density of semiconductor devices, individual semiconductor devices, especially, MOSFETs, have been scaled down. Also, as sub-micron MOSFETs are being more widely used, channel regions disposed between sources and drains are becoming shorter. These changes may cause short channel effects, such as a drop in the threshold voltage of the MOSFET and/or punch-through. To suppress these short channel effects, a method of forming pocket regions by implanting impurity ions between a source or drain region and a channel region under a gate electrode has been proposed.

Figure 1:
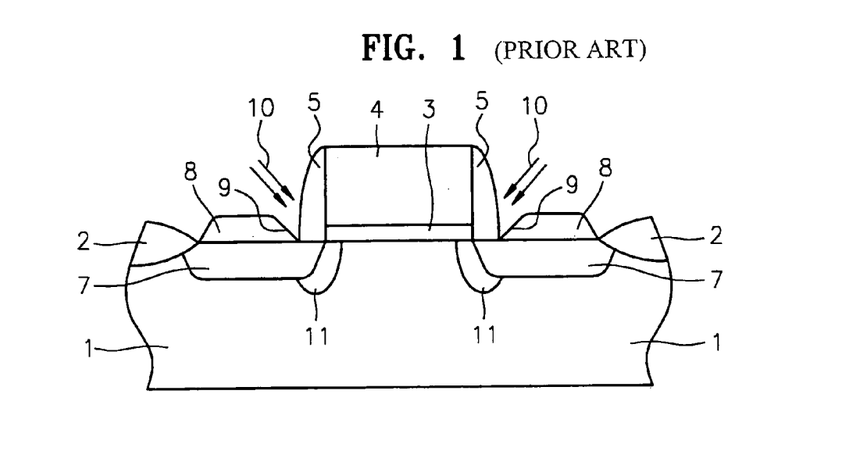
FIG. 1 is a cross-sectional view of a MOSFET with conventional pocket regions.

FIG. 1 is a cross-sectional view of a MOSFET with conventional pocket regions that is disclosed in U.S. Pat. No. 5,733,792. Hereinafter, a conventional method of fabricating a MOSFET with pocket regions will be briefly described with reference to FIG. 1.

As seen in FIG. 1, field oxide layers 2 are selectively formed on the surface of a silicon substrate 1 using local oxidation of silicon (LOCOS), and impurity ions are implanted into the silicon substrate 1 to adjust the threshold voltage. Afterwards, a gate oxide layer 3 is formed on the surface of the silicon substrate 1 using thermal oxidation of silicon. Next, a polysilicon layer 4 is deposited on the gate oxide layer 3 and is then subject to photolithographic and etching processes, thereby completing a polysilicon gate electrode 4.

Next, a silicon oxide layer is deposited on the entire surface of the silicon substrate 1 and anisotropically etched such that silicon oxide spacers 5 are formed on the sidewalls of the polysilicon gate electrode 4. Then, impurity ions are implanted into the silicon substrate 1 using the gate electrode 4 and the spacers 5 as an ion implantation mask, thereby forming source/drain regions 7.

Next, silicon selective growth layers 8 are formed on the source/drain regions 7 through epitaxial growth so as to have a high etch selectivity with respect to the silicon oxide spacers 5. The silicon selective growth layers 8 have facets 9 that face the silicon oxide spacers 5. The facets 9 are almost linearly sloped down to the bottoms of the silicon oxide spacers 5.

Next, impurity ions 10 are obliquely implanted into the silicon substrate 1 using the silicon oxide spacers 5 and the silicon selective growth layers 8 as an ion implantation mask such that pocket regions 11 are formed to be in contact with inside edge portions of the source/drain regions 7.

In the above method, an implantation angle of the impurity ions for forming the pocket regions 11 may be directly affected by the inclination angle of the facets 9 of the silicon selective growth layer 8. Accordingly, to form the pocket regions 11 only at inside edge portions of the source/drain region 7, the height and the angle of the facets 9 of the silicon selective growth layers 8, typically, must be very finely controlled.

Also, in the above conventional method, the silicon oxide spacers 5, which are formed on the sidewalls of the gate electrode 4, are in contact with the silicon selective growth layers 8 having the facets 9 at the outside bottom edges. Thus, when the pocket regions 11 are formed by implanting the impurity ions 10, the concentration and the profile of the pocket regions 11 vary according to not only the materials constituting the silicon selective growth layer 8 and the silicon oxide spacers 5, which function as the ion implantation mask, but also the height of the ion implantation mask, which may be varied based on the implantation angle used to implant the impurity ions through the mask regions. Therefore, it may be difficult to precisely adjust the concentration and the profile of the pocket regions 11.

SUMMARY OF THE INVENTION

Embodiments of the present invention provide methods of fabricating a MOSFET with pocket regions. A gate electrode layer is formed on a semiconductor substrate; and lightly doped drain regions are formed in the semiconductor substrate adjacent the gate electrode layer. A blocking pattern is formed on the semiconductor substrate where the gate electrode layer is formed. The blocking pattern is adjacent and spaced apart from the gate electrode layer a predetermined distance and exposes portions of the semiconductor substrate adjacent sidewalls of the gate electrode layer. Pocket regions are formed in the semiconductor substrate by implanting impurity ions using the gate electrode layer and the blocking pattern as an ion implantation mask. The blocking pattern may include a plurality of blocking layers.

In further embodiments of the present invention, the blocking pattern is removed and spacers are formed on the sidewalls of the gate electrode layer. Impurity ions are implanted using the gate electrode layer having the spacers as an ion implantation mask to form deep source/drain regions in the semiconductor substrate. The implantation of the impurity ions using the gate electrode layer having the spacers as an ion implantation mask to form deep source/drain regions in the semiconductor substrate may be followed by forming a metal silicide layer on a surface of the gate electrode layer and the source/drain regions.

In particular embodiments of the present invention, the semiconductor substrate is a single crystalline silicon substrate and/or a silicon-on-insulator substrate. The gate electrode layer may be polysilicon, a silicon compound and/or a metal.

In still further embodiments of the present invention, forming the blocking pattern includes forming a first blocking layer on a surface of the semiconductor substrate where the gate electrode layer is formed and depositing a second blocking layer on the first blocking layer, the second blocking layer having an etch selectivity with respect to the first blocking layer. A photoresist pattern is formed to be spaced apart from the sidewalls of the gate electrode layer by a predetermined distance, so as to expose portions of the second blocking layer between the photoresist pattern and the sidewalls of the gate electrode layer and a portion of the second blocking layer over the gate electrode layer. The exposed second blocking layer and the first blocking layer are etched using the photoresist pattern as an etch mask and the photoresist pattern is removed.

Depositing the first blocking layer may be preceded by forming a first insulating layer, which has an etch selectivity with respect to the first blocking layer, on the surface of the semiconductor substrate including the exposed surface of the gate electrode layer. The first insulating layer may be a silicon oxide layer, the first blocking layer may be a silicon nitride layer, and the second blocking layer may be a silicon oxide layer. The first blocking layer could also be a SiON layer and/or a SiBN layer. Etching the second blocking layer and the first blocking layer may include removing the first blocking layer that remains on the sidewalls of the gate electrode layer.

In additional embodiments of the present invention, when the pocket regions are formed, the area of the pocket regions is controlled by adjusting a thickness of the blocking pattern and the distance between the sidewalls of the gate electrode layer and the blocking pattern.

In particular embodiments of the present invention, the blocking pattern has a thickness b, the pocket regions are to be formed to have a width d', the impurity ions are implanted at a tilt angle θ and an expected range of Rp and the predetermined distance c that the blocking pattern is spaced apart from the sidewalls is provided by c=d'+b/tan(90−θ)+Rpsin θ.

In certain embodiments of the present invention, forming lightly doped drains is followed by forming pocket regions. In other embodiments of the present invention, forming pocket regions is followed by forming lightly doped drains.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape of the elements is exaggerated for clarity, and the same reference numerals in different drawings represent the same elements.

Figure 2:
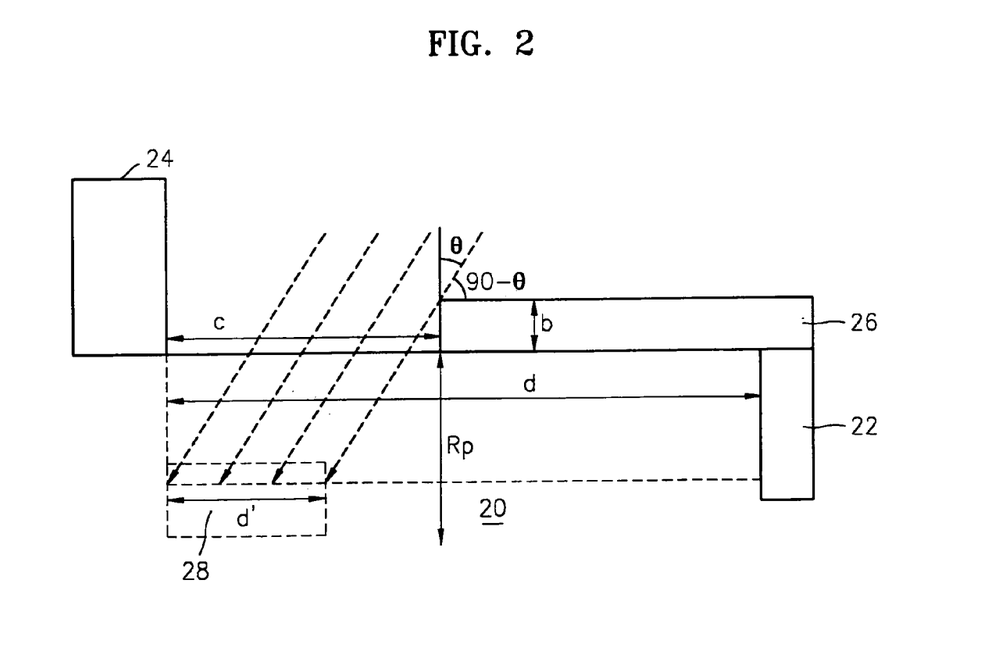
FIG. 2 is a schematic diagram explaining a blocking effect, which occurs in an ion implantation process for forming pocket regions according to embodiments of the present invention.

FIG. 2 is a schematic diagram explaining a blocking effect, which occurs in an ion implantation process for forming a pocket region according to embodiments of the present invention. Referring to FIG. 2, a device isolation region 22, which is formed of a trench oxide layer and/or a field oxide layer, is provided on a portion of a surface of a semiconductor substrate 20. A gate electrode 24 is provided on a portion of the semiconductor substrate 20 and is spaced apart from the device isolation region 22 by a predetermined distance d. A blocking layer 26 covers a portion of the surface of the semiconductor substrate 20 between the device isolation region 22 and the gate electrode 24. A pocket region 28 is formed adjacent to a bottom portion of a sidewall of the gate electrode 24 by implanting impurity ions to a predetermined depth and tilted at an angle of 90−θ from a surface of the semiconductor substrate 20.

In FIG. 2, reference character b is a thickness of the blocking layer 26, c is a distance between the gate electrode 24 and the blocking layer 26, d is a distance between the device isolation region 22 and the gate electrode 24, d' is a width of the pocket region 28, θ is a tilt angle at which impurity ions are implanted (referenced to, for example, the substrate 20), and Rp is a projected range of ion implantation.

In FIG. 2, when impurity ions are implanted into the semiconductor substrate 20 at a tilt angle of θ, a ratio (r) of a pocket junction region formed by the ion implantation, i.e., the ratio (r) of the width d' of the pocket region 28 for the case where the blocking layer 26 is present to the width d of the pocket region 28 for the case where the blocking layer 26 is not present, can be represented by the following equation.

$$\text{Ratio } (r) = d'/d = (c - b/\tan(90-\theta) - Rp \sin \theta)/d \tag{1}$$

For example, in the case where a design-rule distance d between the device isolation region 22 and the gate electrode 24 is 1500 Å; a projected range Rp obtained in consideration of the energy and the concentration of a dopant is 600 Å; a titlangle θ is 30°; and a ratio (r) of the pocket region 28 is aimed at 50%. Then, the following relationship equation is formed between the thickness b of the blocking layer 26 and the distance c between the gate electrode 24 and the blocking layer 26.

$$c - b/\sqrt{3} = 1050 \tag{2}$$

Accordingly, if the thickness b of the blocking layer 26 and the distance c between the gate electrode 24 and the blocking layer 26 satisfy the relationship equation, the ratio (r) of the width d' of the pocket region 28 formed with the blocking layer 26 to a pocket region formed without the blocking layer 26 can be maintained at 50%. Thus, the entire junction capacitance can be reduced to 50%.

Figure 3:
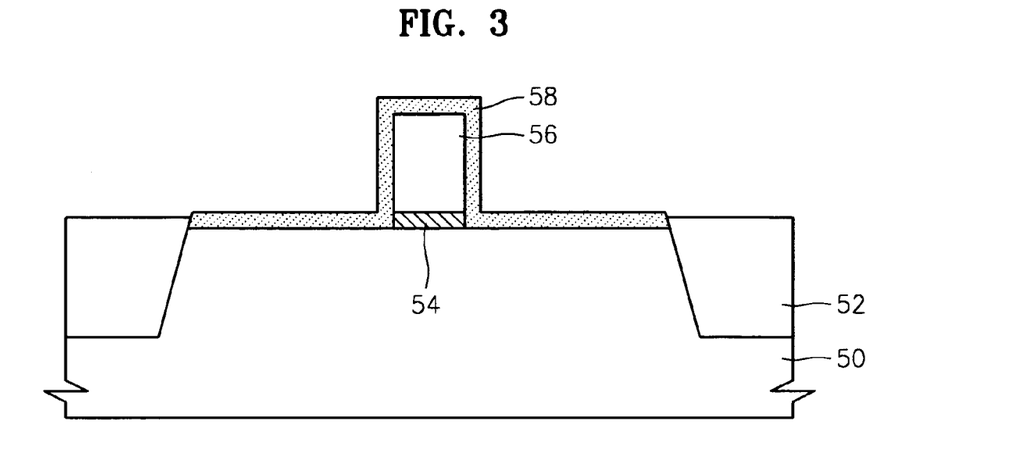
FIGS. 3 through 14 are cross-sectional views illustrating methods of fabricating a MOSFET with pocket regions according to embodiments of the present invention.

FIGS. 3 through 14 are cross-sectional views illustrating methods of fabricating MOSFETs with pocket regions according to the embodiments of the present invention. Referring to FIG. 3, a device isolation region 52 formed of an insulating material is formed in a semiconductor substrate 50 using typical device isolation, such as LOCOS and/or shallow trench isolation (STI). Next, a material (e.g., an oxide layer) for a gate insulating layer 54 and a material (e.g., a polysilicon layer) for a gate electrode layer 56 are sequentially deposited on the surface of the semiconductor substrate 50 and patterned using conventional photolithography. Afterwards, a first insulating layer 58 is formed using oxidation of the exposed surfaces of the semiconductor substrate 50 and the gate electrode layer 56.

The gate insulating layer 54 may be $SiO_2$, $Si_3N_4$, SiON, $ZrO_2$, $HfO_2$, $Ta_2O_5$ and/or $Al_2O_3$. Also, the gate electrode layer 56 may be polysilicon, a silicon compound and/or a metal. Although, in the present embodiments, the semiconductor substrate 20 is a single crystalline silicon substrate, in other embodiments, a silicon on insulator (SOI) substrate may be used instead.

Figure 4:
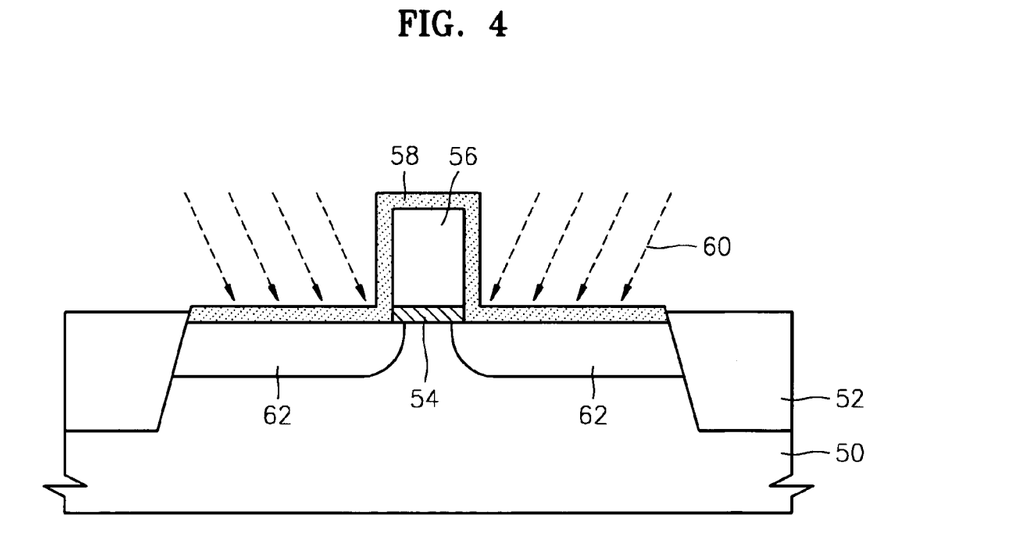

Referring to FIG. 4, first ion implantation regions 62 (LDD regions) are formed in the semiconductor substrate 50 on which the first insulating layer 58 is formed by implanting ions 60 using the gate electrode layer 56 as a mask. The LDD regions 62, which cause a drop in an electric field to prevent hot carrier effect, are typically formed by implanting impurity ions at a low energy of several KeV or less.

Figure 5:
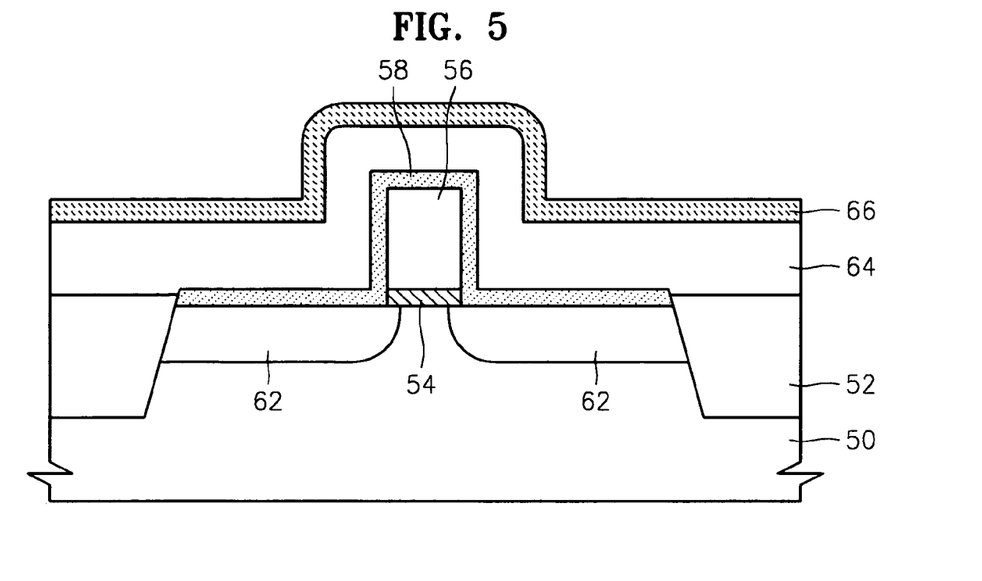

Referring to FIG. 5, after forming the first ion implantation regions 62, a first blocking layer 64 and a second blocking layer 66 are sequentially formed on the semiconductor layer 50. For example, the first blocking layer 64 is formed of nitride, and the second blocking layer 66 is formed of a material having an etch selectivity with respect to the first blocking layer 64, for example, an oxide. As described above, the thickness of the first blocking layer 64 and the second blocking layer 66 determine the area of a region shadowed by the first blocking layer 64 and the second blocking layer 66 during further ion implantation for forming pocket regions. Although the present embodiments propose a blocking layer including the first blocking layer 64 and the second blocking layer 66, it is also possible to form three or more blocking layers. Furthermore, in place of, or in addition to, a silicon nitride layer, the first blocking layer 64 may be formed of SiON and/or SiBN, which has an etch selectivity with respect to a silicon oxide layer.

Figure 6:
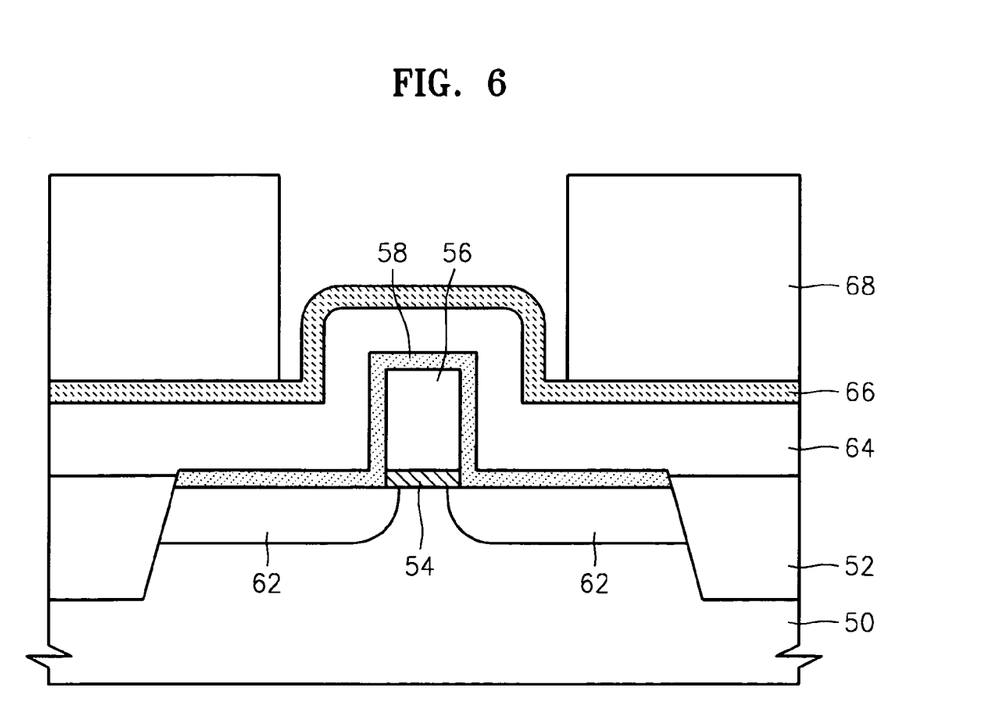

Referring to FIG. 6, a photoresist pattern 68 is formed on the second blocking layer 66. The photoresist pattern determines the width of a blocking pattern, which, along with the thickness of the blocking layer, determines the area of the pocket regions.

Figure 7:
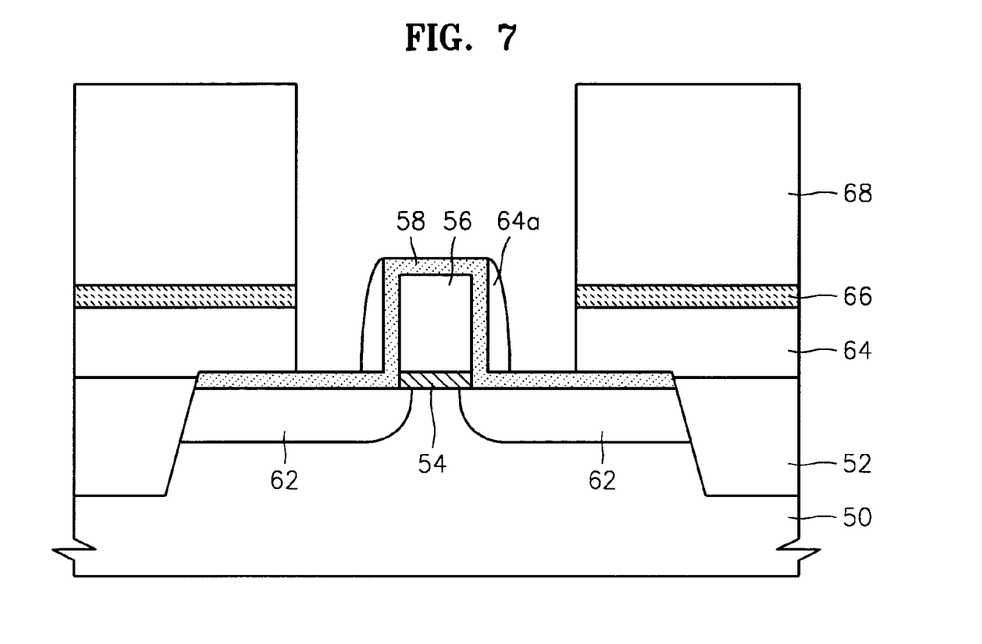

Referring to FIG. 7, the exposed second blocking layer 66 and the first blocking layer 64 are removed by an etchback process using the photoresist pattern 68 as an etch mask. As a result, a portion of the first blocking layer 64 remains on the first insulating layer 58 disposed on the sidewalls of the gate electrode layer 56, thereby forming first blocking spacers 64a.

Figure 8:
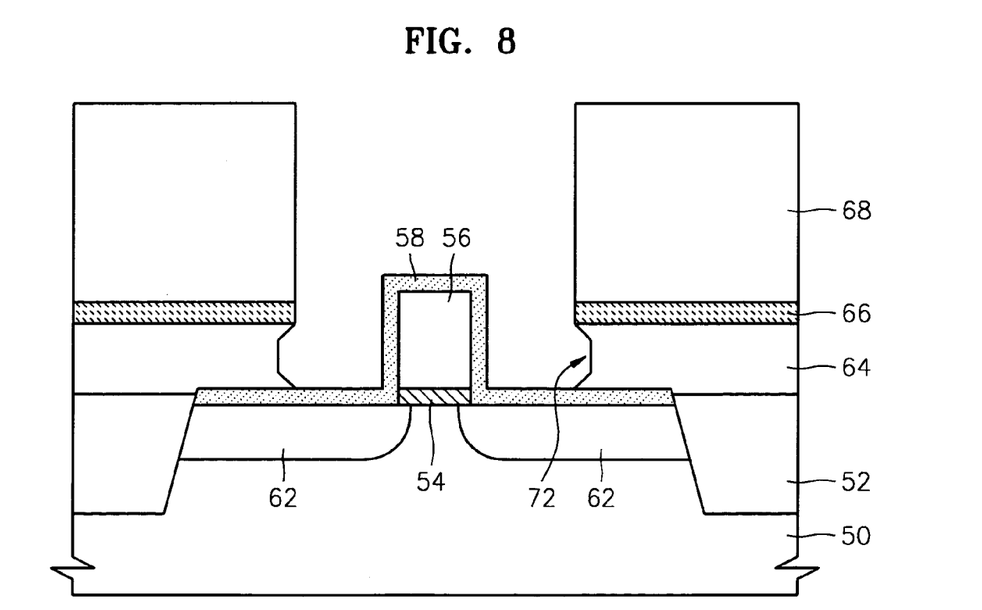

Referring to FIG. 8, to remove the remaining first blocking spacers 64a, a wet etch process is carried out using a material having a high etch selectivity with respect to the second blocking layer 66. In certain embodiments, the wet etch process employs phosphoric acid ($H_3PO_4$), of which an etch selectivity of a nitride layer to an oxide layer is 40:1. As shown in FIG. 8, because the first blocking layer 64, a nitride layer, is easily stripped by phosphoric acid, while the first blocking spacers 64a are wholly removed, the exposed surface of the first blocking layer 64 disposed under the second blocking layer 66 is partially etched. Thus, an undercut part 72 is formed. On the other hand, the second blocking layer 66 is not etched and maintains its patterned shape.

Figure 9:
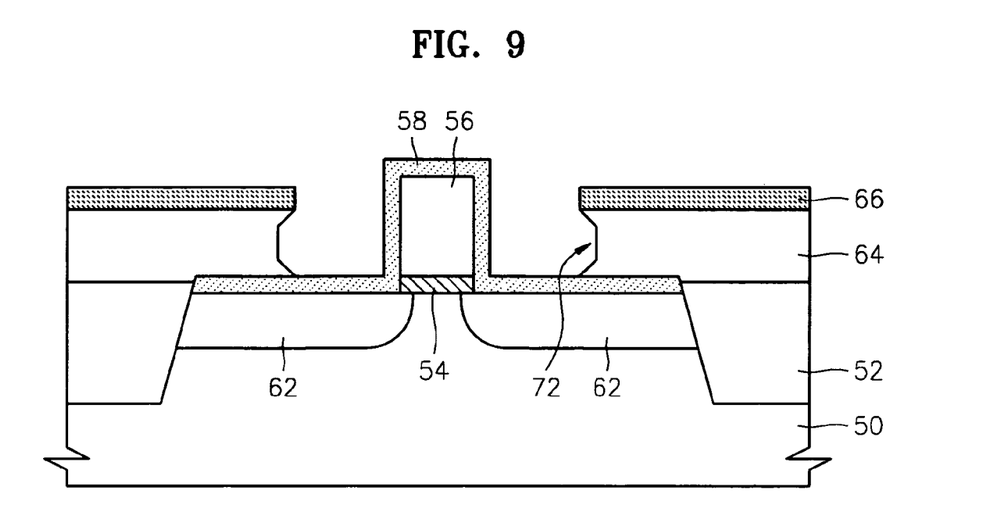

Referring to FIG. 9, the blocking pattern is completed by removing the photoresist pattern 68. The photoresist pattern 68 may be removed by conventional methods using sulfuric acid and hydrogen peroxide solution.

Figure 10:
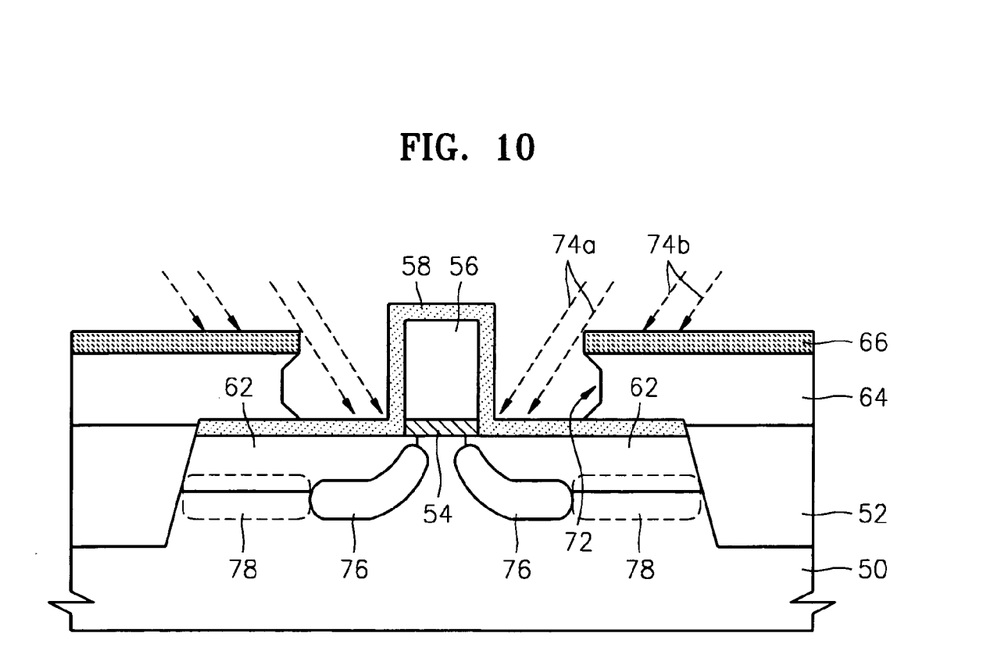

Referring to FIG. 10, second impurity ions 74a and 74b are implanted at a predetermined tilt angle using the blocking pattern and the gate electrode pattern as an ion implantation mask, thereby forming pocket regions 76 at the bottom sidewalls of the gate electrode layer 56 in the vicinity of channel inner junctions of the first ion implantation regions 62. More specifically, some second impurity ions 74a, which are not blocked by the blocking pattern, are implanted to form the pocket regions 76 in the semiconductor substrate 50 at a predetermined depth, whereas other, second impurity ions 74b are blocked by the blocking pattern and not implanted into the semiconductor substrate 50. In FIG. 10, portions illustrated with dotted lines represent conceptual blocking regions 78, which are blocked by the blocking pattern and where the second impurity ions 74b are not implanted. Accordingly, the pocket regions 76 are locally defined by the blocking pattern and have a predefined area.

Figure 11:
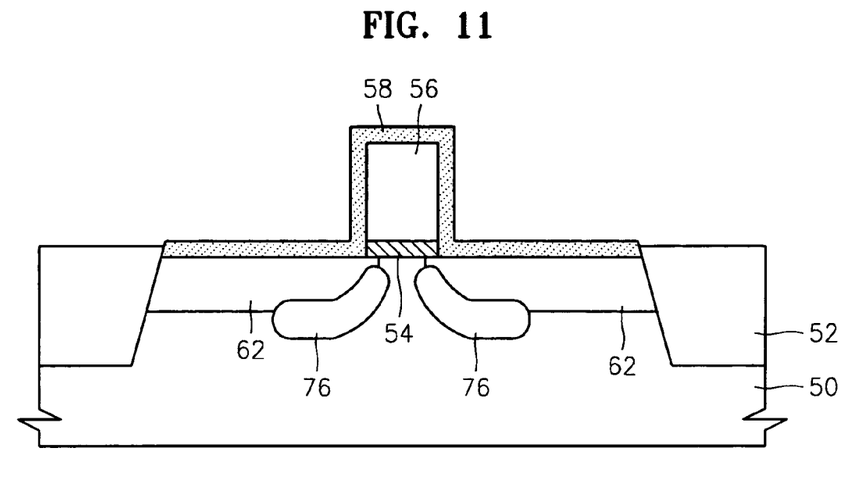

Referring to FIG. 11, the blocking pattern is removed. That is, the oxide layer for the second blocking layer 66 is wet etched using a hydrogen fluoride solution, while the nitride layer for the first blocking layer 64 is wet etched using phosphorus acid having a high etch selectivity with respect to the oxide layer. Here, the oxide layer for the first insulating layer 58 is used to prevent the gate electrode layer and the semiconductor substrate 50 from suffering etching damage.

Figure 12:
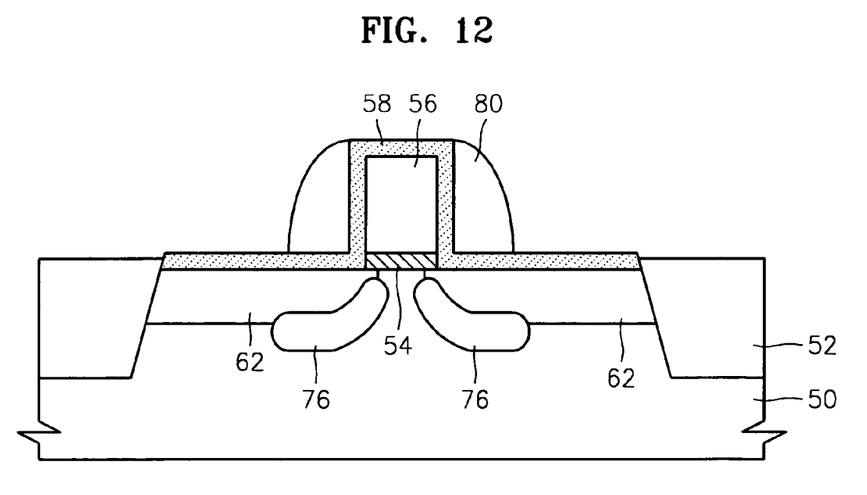

Referring to FIG. 12, gate spacers 80 are formed on the sidewalls of the gate electrode layer 56 to a predetermined thickness. The gate spacers 80 are used as an ion implantation mask for forming deep source/drain regions. The gate spacers 80 may be formed of nitride, oxide or a combination thereof. Forming the gate spacers 80 may be provided by depositing a material for the gate spacers 80 on the surface of the semiconductor substrate 50 and then etching back the material layer until the surface of the first insulating layer 58 is exposed.

Figure 13:
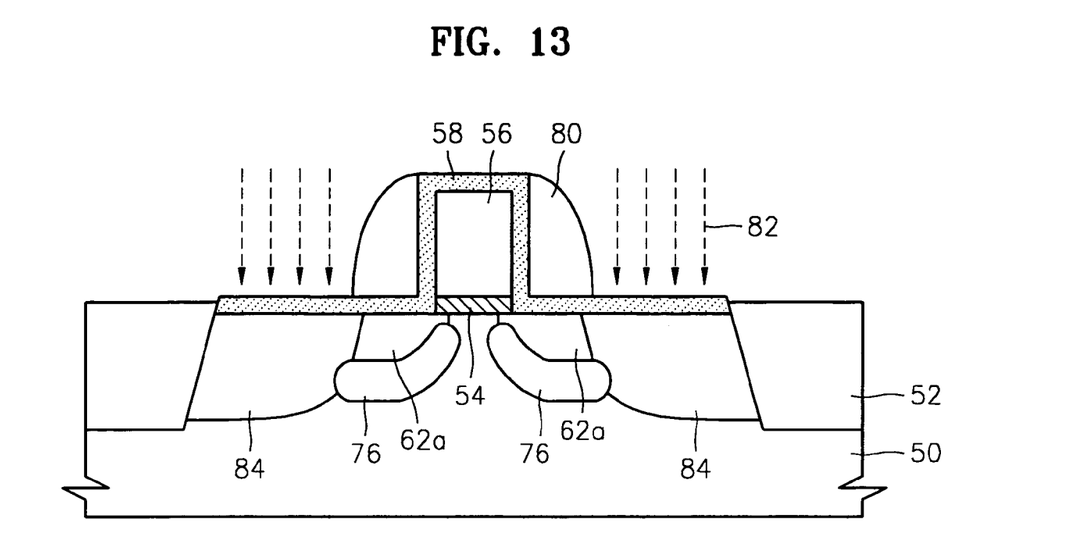

Referring to FIG. 13, third impurity ions 82 are heavily implanted using the gate spacers 80 as an ion implantation mask at an energy of about several tens KeV, thereby forming third ion implantation regions 84, which are deep source/drain regions, in the vicinity of the pocket regions 76 and the device isolation region 52.

Figure 14:
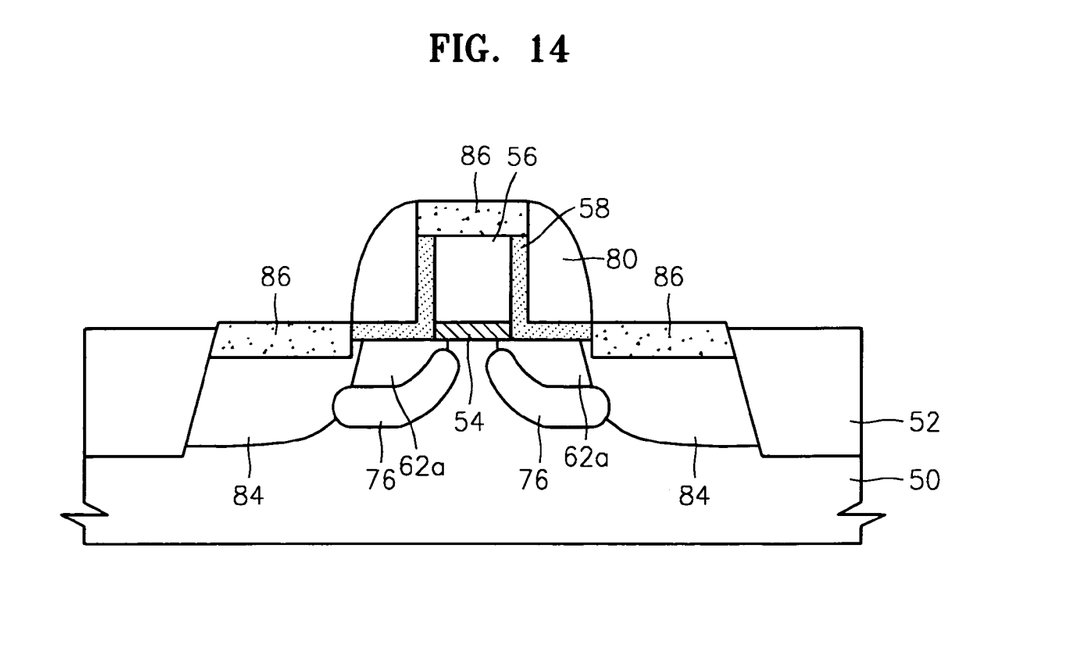

Referring to FIG. 14, a metal silicide layer 86 is formed on the surface of the semiconductor substrate 50, where the first insulating layer 58 formed of oxide is exposed, and on the surface of the gate electrode layer 56. The metal silicide layer 86 is formed by depositing cobalt, nickel and/or titanium and then performing a silicidation process.

While certain embodiments of the present invention that provide for forming the LDD regions followed by forming the pocket regions 76 are described with reference to FIGS. 3 through 14, the present invention is not limited thereto. For example, after forming a blocking pattern, pocket regions may be formed using a blocking pattern as an ion implantation mask and then LDD regions may be formed. More specifically, certain methods of the present invention include forming a blocking pattern, forming pocket regions, removing the blocking pattern, forming LDD regions in a semiconductor substrate using a gate electrode layer as an ion implantation mask, forming spacers on the sidewalls of the gate electrode layer, and forming deep source/drain regions in the semiconductor substrate using the gate electrode layer including the spacers as an ion implantation mask.

While the present invention has been particularly shown and described with reference to particular embodiments thereof, it will be understood by those of ordinary skill in the art that various changes in form and details may be made therein without departing from the spirit and scope of the present invention as defined by the following claims.

What is claimed is:

1. A method of fabricating a MOSFET with pocket regions, comprising:
   forming a gate electrode layer on a semiconductor substrate;

forming lightly doped drain regions in the semiconductor substrate adjacent the gate electrode layer;

forming a device isolation region on the semiconductor substrate surrounding the lightly doped drain regions adjacent the gate electrode layer;

forming a blocking pattern on the semiconductor substrate, the blocking pattern being adjacent and spaced apart from the gate electrode layer a predetermined distance and exposing portions of the semiconductor substrate adjacent sidewalls of the gate electrode layer and extending over the device isolation region and onto the lightly doped drain regions adjacent the gate electrode layer; and forming pocket regions in the semiconductor substrate by implanting impurity ions at an oblique tilt angle into a surface of the semiconductor substrate between the blocking pattern and the gate electrode layer using the gate electrode layer and the blocking pattern as an ion implantation mask to define a width of the pocket regions.

2. The method of claim 1, further comprising;

removing the blocking pattern;

forming spacers on the sidewalls of the gate electrode layer; and implanting impurity ions using the gate electrode layer having the spacers as an ion implantation mask to form deep source/drain regions in the semiconductor substrate.

3. The method of claim 1, wherein the semiconductor substrate is a single crystalline silicon substrate and/or a silicon-on-insulator substrate.

4. The method of claim 1, wherein the gate electrode layer comprises polysilicon, a silicon compound and/or a metal.

5. A method of fabricating a MOSFET with pocket regions, comprising:

forming a gate electrode layer on a semiconductor substrate;

forming lightly doped drain regions in the semiconductor substrate adjacent the gate electrode layer;

forming a blocking pattern on the semiconductor substrate, the blocking pattern being adjacent and spaced apart from the gate electrode layer a predetermined distance and exposing portions of the semiconductor substrate adjacent sidewalls of the gate electrode layer; and forming pocket regions in the semiconductor substrate by implanting impurity ions using the gate electrode layer and the blocking pattern as an ion implantation mask;

wherein forming the blocking pattern comprises:

forming a first blocking layer on a surface of the semiconductor substrate where the gate electrode layer is formed;

depositing a second blocking layer on the first blocking layer, the second blocking layer having an etch selectivity with respect to the first blocking layer;

forming a photoresist pattern to be spaced apart from the sidewalls of the gate electrode layer by a predetermined distance, so as to expose portions of the second blocking layer between the photoresist pattern and the sidewalls of the gate electrode layer and a portion of the second blocking layer over the gate electrode layer;

etching the exposed second blocking layer and the first blocking layer using the photoresist pattern as an etch mask; and removing the photoresist pattern.

6. The method of claim 5, wherein depositing the first blocking layer is preceded by forming a first insulating layer, which has an etch selectivity with respect to the first blocking layer, on the surface of the semiconductor substrate including the exposed surface of the gate electrode layer.

7. The method of claim 6, wherein the first insulating layer is a silicon oxide layer, the first blocking layer is a silicon nitride layer, and the second blocking layer is a silicon oxide layer.

8. The method of claim 6, wherein the first insulating layer is a silicon oxide layer, the first blocking layer is SiON layer and/or a SiBN layer, and the second blocking layer is a silicon oxide layer.

9. The method of claim 5, wherein etching the second blocking layer and the first blocking layer further comprises removing the first blocking layer that remains on the sidewalls of the gate electrode layer.

10. The method of claim 1, wherein, when the pocket regions are Conned, the area of the pocket regions is controlled by adjusting a thickness of the blocking pattern and the distance between the sidewalls of the gate electrode layer and the blocking pattern.

11. The method of claim 2, wherein implanting impurity ions using the gate electrode layer having the spacers as an ion implantation mask to form deep source/drain regions in the semiconductor substrate is followed by forming a metal silicide layer on a surface of the gate electrode layer and the source/drain regions.

12. The method of claim 1, wherein forming a blocking pattern on the semiconductor substrate comprises forming a blocking pattern comprising a plurality of blocking layers.

13. The method of claim 1, wherein the blocking pattern has a thickness b, the pocket regions are to be formed to have a width d', the impurity ions are implanted at a tilt angle $\theta$ and an expected range of Rp, the predetermined distance c that the blocking pattern is spaced apart from the sidewalls comprises $c = d' + b/\tan(90-\theta) + Rp\sin\theta$.

14. The method of claim 1, wherein forming lightly doped drains is followed by forming pocket regions.

15. The method of claim 1, wherein forming pocket regions is followed by forming lightly doped drains.

* * * * *

UNITED STATES PATENT AND TRADEMARK OFFICE
CERTIFICATE OF CORRECTION

PATENT NO. : 7,052,965 B2
APPLICATION NO. : 10/780245
DATED : May 30, 2006
INVENTOR(S) : Park et al.

It is certified that error appears in the above-identified patent and that said Letters Patent is hereby corrected as shown below:

Column 8,
Line 49 should read -- comprises $c = d' + b/\tan(90-\theta) + R p \sin\theta$. --

Signed and Sealed this

Twenty-first Day of November, 2006

JON W. DUDAS
*Director of the United States Patent and Trademark Office*